United States Patent
Martin et al.

(10) Patent No.: US 6,404,651 B1
(45) Date of Patent: Jun. 11, 2002

(54) COMPUTER EXPANSION CARD SHIELD RETENTION DEVICE

(75) Inventors: Bradley L. Martin, Byron; William Michael Monson; Stephen Peter Mroz, both of Rochester, all of MN (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 09/722,869

(22) Filed: Nov. 27, 2000

(51) Int. Cl.[7] .................................................. H05K 7/14
(52) U.S. Cl. ...................... 361/801; 361/753; 361/759; 361/800; 361/816; 361/825; 174/35 R; 211/41.17; 206/706
(58) Field of Search ................................. 361/683–686, 361/752, 753, 759, 796, 797, 800, 801, 816, 818, 825; 174/35 R; 211/41.17; 206/706, 719

(56) References Cited

U.S. PATENT DOCUMENTS

| | | | |
|---|---|---|---|
| 4,744,006 A | | 5/1988 | Duffield |
| 4,745,524 A | * | 5/1988 | Patton, III .................. 361/759 |
| 5,575,546 A | * | 11/1996 | Radloff ........................ 312/183 |
| 5,640,309 A | | 6/1997 | Carney et al. |
| 5,686,695 A | * | 11/1997 | Chan ...................... 174/35 GC |
| 5,726,866 A | | 3/1998 | Allen |
| 6,058,025 A | | 5/2000 | Ecker et al. |

\* cited by examiner

Primary Examiner—Jayprakash N. Gandhi
(74) Attorney, Agent, or Firm—Wood, Herron & Evans, L.L.P.

(57) ABSTRACT

An enclosure and method of making the same provides mounting provisions for shields of expansion cards in a general purpose computer that reduce the number of components and manufacturing steps to produce the enclosure, as well as reducing the time required to add or remove expansion cards. In particular, a housing of an enclosure incorporates a shield mount to receive a shield having an extending tongue and a lateral tab. A specific example of such a shield is tail stock for a Peripheral Component Interconnection (PCI) expansion card. In particular, a receptor is formed into the housing for receiving the extending tongue of the shield. A support member extends outward from the enclosure to abut an outwardly bent tab of the shield that projects out of the panel through a tab opening adjacent to the support member. The support member includes a locking detent that fits within a locking recess in the tab of the shield. A cover of the enclosure mounts to the housing and includes a cover projection that abuts the tab of the shield from a disengagement direction, cooperating with the support member to lock the tab of the shield in place when the cover is installed.

22 Claims, 7 Drawing Sheets

COMPUTER EXPANSION CARD SHIELD RETENTION DEVICE

FIELD OF THE INVENTION

The invention is generally related to expansion card mounting provisions in a computer enclosure, and in particular to Peripheral Component Interconnection (PCI) circuit board shield attachments to a housing of a computer enclosure.

BACKGROUND OF THE INVENTION

General purpose computers are widely used in homes and businesses to perform many functions. Adapting general purpose computers to perform these varied functions is supported by a flexible architecture. Users may select among a variety of user interface peripheral devices, communication devices, and mass storage devices to configure a general purpose computer for a specific application.

An enclosure for general purpose computers, also referred to as computer chassis or case, supports a flexible computer architecture with provisions for internally mounting various devices such as circuit boards and disk drives. An enclosure also includes provisions for connecting to peripheral devices outside of the enclosure. Examples of such connections include parallel and serial ports.

The Peripheral Component Interconnect (PCI) standard is an example of an expansion card approach to support both objectives of supporting internal components and communicating with external devices. Expansion card slots within an enclosure provide space for additional circuit boards as well as electrical interconnections to other components within the enclosure, such as a parallel data bus to a motherboard. Each expansion card slot may have access to the exterior of the enclosure via an expansion slot opening in the enclosure for interconnections to peripheral devices. A PCI shield, or tail stock, registers over the expansion slot opening, making substantial electrical contact to the enclosure to provide Electromagnetic Compatibility (EMC), reducing radio frequency (RF) emissions from or into the enclosure via the expansion slot opening. The PCI shield also prevents cooling air flow from being inadvertently diverted and causing overheating within portions of the enclosure. In addition, the enclosure includes mountings for each PCI shield to physically secure the PCI shield in place, and any circuit board attached to the shield.

Mounting provisions for PCI shields are conventionally made with a large rectangular hole in the enclosure across which a PCI bracket is welded. A PCI bracket is typically capable of retaining multiple PCI shields. The PCI bracket conforms to the shape of PCI shields with physical retention provided by a combination of guides into which tongues defined at the ends of each of the multiple PCI shields may be slid to orient the PCI shields in a generally parallel relationship. Fasteners such as screws, flip latch mechanisms or clips are typically used to secure lateral tabs at the opposite ends of the PCI shields and thereby secure the shields within the PCI bracket. A PCI shield with no card attached (blanking cover) is used to close openings when no expansion card is needed.

Conventional PCI mounting provisions do secure the PCI shield, provide EMC features, and close the expansion slot opening to the expansion card slot. However, the requirement for a PCI bracket adds another component to the enclosure, as well as another manufacturing step to weld the PCI bracket to the enclosure. Similarly, the fastener for each expansion card slot increases the time required to assemble a general purpose computer or to perform upgrades and maintenance. Therefore, a significant need exists for an improved enclosure for a general purpose computer for mounting PCI expansion cards.

SUMMARY OF THE INVENTION

The invention addresses these and other problems associated with the prior art by providing an enclosure and method of making the same in which a housing and a cover are used to cooperatively retain an expansion card shield within the enclosure. In particular, an enclosure includes a housing with a receptor and a tab opening. The tab of the shield is allowed to extend through the tab opening when the shield is placed within the enclosure in a disengaged position. The tab opening is sized to allow the shield to be moved longitudinally to an engaged position wherein a tongue of the shield engages the receptor. The cover then retains the shield in the engaged position by restricting movement of the tab of the shield when the cover is secured to the enclosure.

In another aspect consistent with the invention, a method of making an enclosure for receiving a shield includes defining an expansion card shield mounting sized for the tongue of the shield. A tab opening in the panel is formed at a first end of the expansion card shield mounting, with the tab opening laterally sized to receive the tab of the shield with the tongue of the shield proximate to and aligned with the expansion card shield mounting. The tab opening is longitudinally sized to allow displacement of the tab along the longitudinal axis of the expansion card shield mounting between a disengaged position and an engaged position. A receptor is formed at a second end of the expansion card shield mounting longitudinally displaced from the tab opening sufficient to clear the tongue of the shield when the tab is inserted through the tab opening at the disengaged position and to engage the tongue of the shield when the tab is translated to the engaged position.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there are described exemplary embodiments of the invention.

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

For purposes of this description, words such as "inward", "outward", "front", "rear", "up", "right", "left", "down", and the like are applied in conjunction with the drawings for purposes of clarity. As is well known, enclosures may be oriented in substantially any orientation, so these directional words should not be used to imply any particular absolute directions for an enclosure consistent with the invention.

Figure 1:
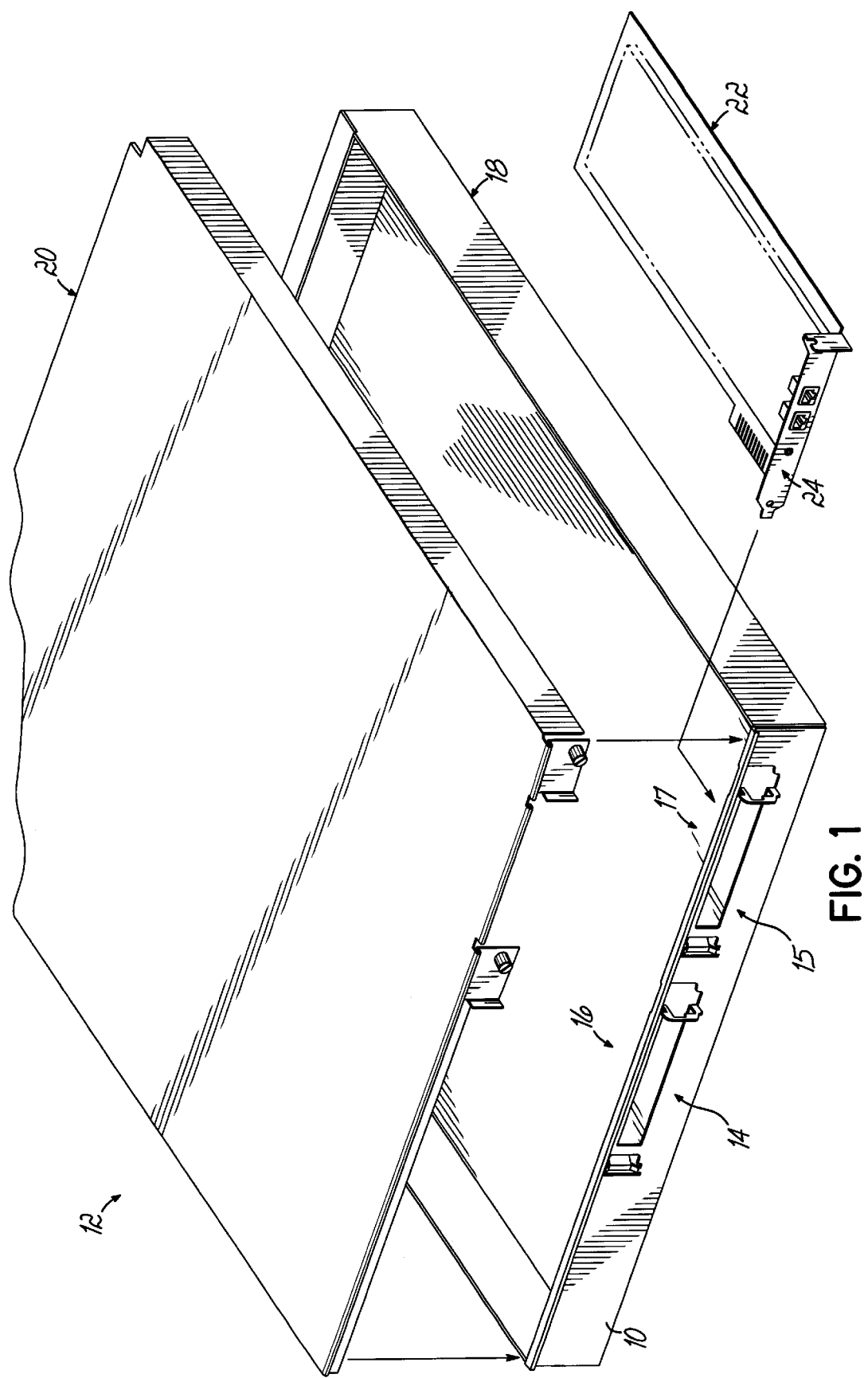
FIG. 1 is a perspective exploded view of a computer enclosure for use in retaining an expansion card in a manner consistent with the invention.

FIG. 1 is a perspective exploded view of a panel, such as a tailgate 10, of a computer enclosure 12 having horizontally aligned shield mounts 14, 15 behind which may be placed computer expansion cards in expansion card slots 16, 17. The tailgate 10 is a rear portion of a housing 18. The housing 18 substantially encompasses and supports electronic components. The enclosure 12 also includes a cover 20 that mounts to the housing 18.

An example of an expansion card suitable for use in enclosure 10 is a Peripheral Component Interconnect (PCI) circuit board 22 that includes an Electromagnetic Compatibility (EMC) shield 24 along one edge for being positioned against the inside of the tailgate 10. The shield 24 provides structural mounting features for the expansion card 22. Additionally, the shield 24 often includes a connector (not shown in FIG. 1) that is intended to extend outside of the computer enclosure 12. Typically, the shield 24 is made of stamped sheet steel, providing the desired structural strength as well as serving as an EMC barrier for a connector opening, or more generally an expansion slot opening 26, in the computer enclosure 12.

Figure 2:
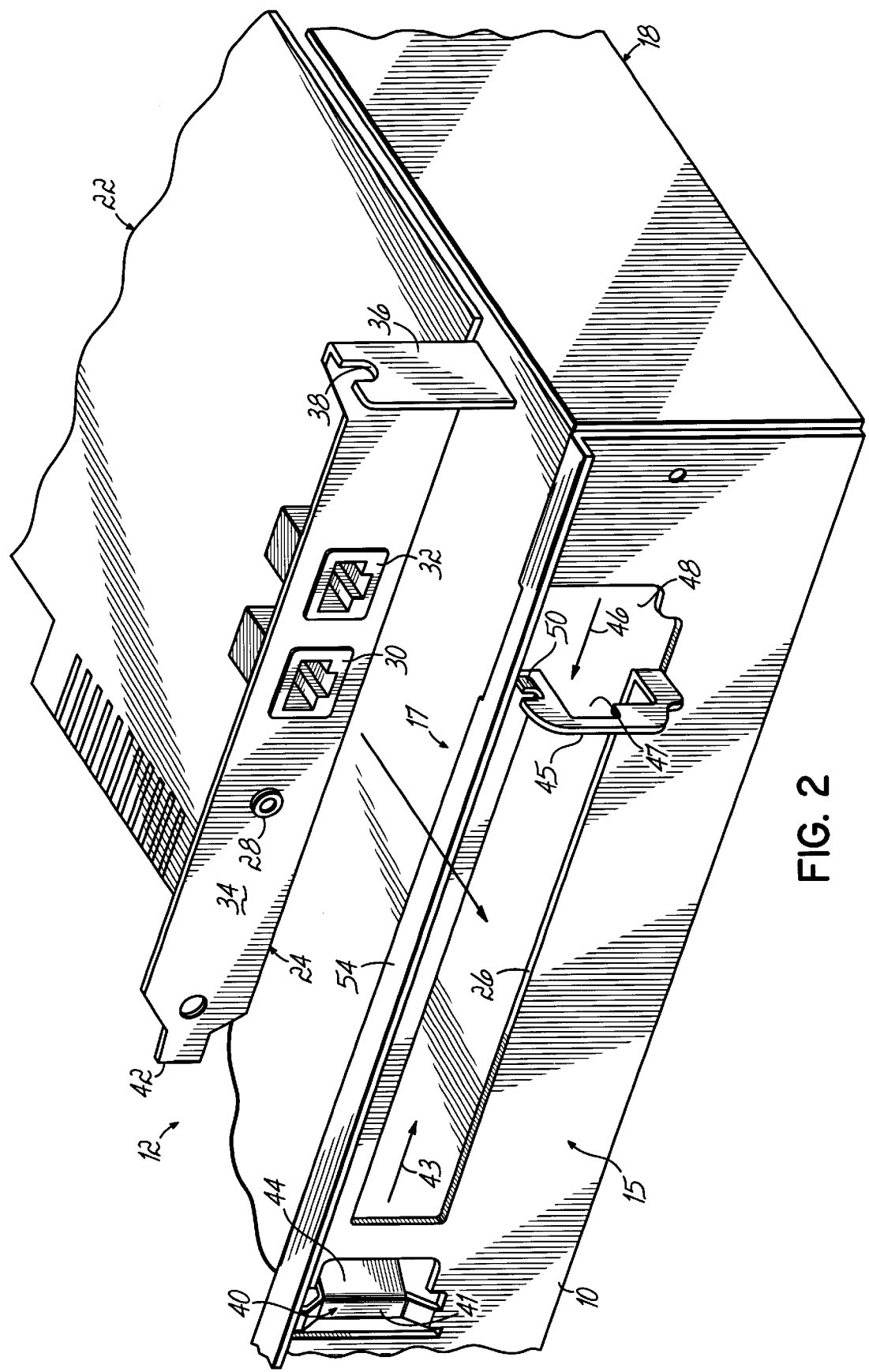
FIG. 2 is a perspective view of the enclosure of FIG. 1 with the shield of an expansion card aligned for insertion into a shield mount in the enclosure.

FIG. 2 is a perspective view of the shield 24 of the PCI circuit board 22 of FIG. 1 aligned for insertion into the shield mount 14 of tailgate 10. The shield 24 is depicted with features commonly included in PCI circuit boards 22. Connectors 28, 30, 32 are externally facing on an extending tongue 34 of the shield 24. Opening 26 in the tailgate 10 is sized to allow external access to the connectors 28, 30, 32 and to be substantially covered by the extending tongue 34 of the shield 24. The shield 24 also includes a laterally extending tab 36, which is generally perpendicularly bent for the illustrative stamped steel PCI shield 24. The lateral tab 36 includes a locking recess 38 through which it is known in other applications to insert a screw into a PCI bracket to hold the shield 24 against a tailgate after inserting the extending tongue 34 into a PCI bracket.

It should be appreciated that in some applications an expansion slot opening 26 is not required or desired and may be omitted. In such applications, a shield 24 consistent with aspects of the invention provides structural support to an expansion card and need not provide EMC and connector features. In addition, other circuit boards and devices may advantageously use a shield 24 consistent with aspects of the invention that are intended for permanent installation in an enclosure, rather than an upgrade in an expansion slot. Furthermore, a shield 24 without any attached circuit board 22 may be advantageously used to close an expansion slot opening 26. In addition, a shield 24 consistent with aspects of the invention may comprise various geometries of an extending tongue 34 and a tab 36.

The shield mount 14 is advantageously formed from sheet material by machining or stamping out the expansion slot opening 26. Also, a contour for a receptor 40 is stamped as a lateral band 41 across the shield mount 14 that is inwardly displaced from a plane of the tailgate 10 to receive a narrow end 42 of the extending tongue 34. Generally, the inward displacement of the receptor 40 narrows to approximately the cross section of the extending tongue 34 of the shield 24, providing a structural support in each direction, except in a disengaging direction, as at arrow 43, where the receptor 40 generally only provides frictional resistance. To guide the narrow end 42 of the tongue 34 into the lateral band 41, the receptor 40 includes a ramp 44 along a side in the disengaging direction 43 that is further inwardly deflected.

In certain applications, receptors 40 consistent with aspects of the invention may include a plurality of discrete components that cooperatively guide and restrict the tongue 34 of the shield 24. Thus, a guide pin or a channel, open toward the shield mount 14 may receive or restrict one of the narrow edge of the end 42 or a lateral edge of the tongue 34.

A contour for a support member 45 is stamped and outwardly bent from the plane of the tailgate 10, in a hinged movement about an edge toward an engaging direction, as in arrow 46, along a longitudinal axis of the shield mount 14. The support member 45 includes a recess 47 integrated with the expansion slot opening 26 to accommodate any outwardly projecting connector (not shown) near the tab 36 on the shield 24. A tab opening 48 is formed adjacent to the support member 45, opposite to the expansion slot opening 26. The tab opening 48 is advantageously formed when the support member 45 is stamped out of the sheet material of the tailgate 10.

The generally rectangularly shaped tab opening 48 is laterally sized to receive the tab 36 in the disengaged position, wherein the tongue 34 of the shield 24 is placed against or proximate to the inside surface of the tailgate 10. The tab opening 48 is longitudinally sized and positioned with respect to the receptor 40 to allow the tab 36 to be received sufficiently in the disengaging direction 43 so that the tongue 34 is not impeded by the receptor 40. Moreover, the tab opening 48 allows longitudinal displacement of the tab 36 in the engaging direction 46 so that the tongue 34 engages the receptor 40.

The support member 45 also may include a locking detent 50 that registers to the locking recess 38 of the tab 36. The locking detent 50 is advantageously stamped and bent from the sheet material of the tailgate 10, although other geometries and manufacturing methods may be used in the alternative.

It should be appreciated that the fabrication of a shield mount 14 entirely from a single sheet of material such as sheet steel reduces manufacturing costs. However, in some applications consistent with aspects of the invention, the various features of shield mount 14 may be provided as separate components, and that the slot may be molded from alternate materials and otherwise assembled in various other manners known to those skilled in the art having the benefit of the present disclosure. Furthermore, in some applications consistent with the invention, the support member 45 may be omitted with the shield 24 held securely in place by the cooperation between the tab opening 48, cover 20 and receptor 40.

Figure 3:
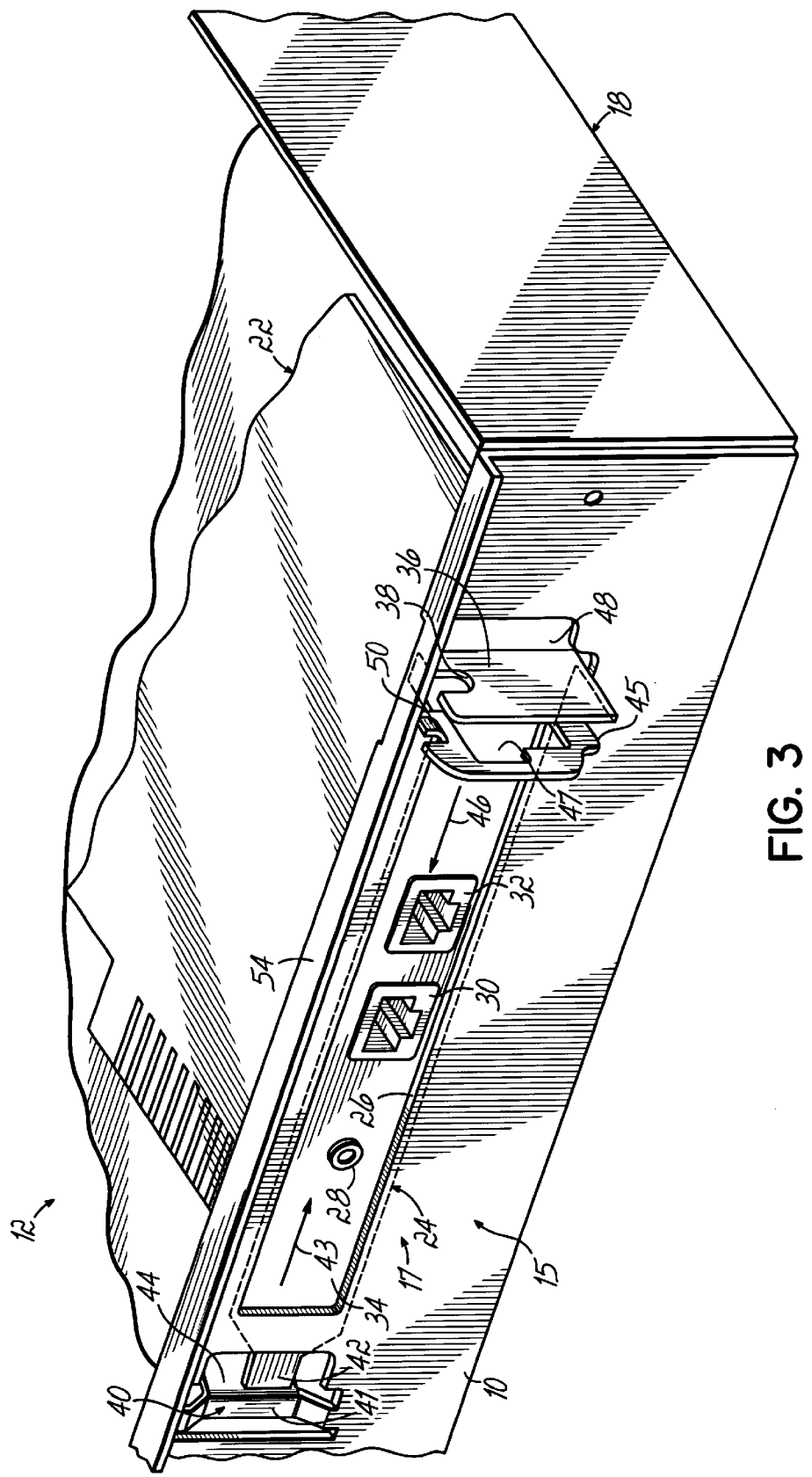
FIG. 3 is a perspective view of the enclosure of FIG. 1, with the shield of the expansion card inserted into the shield mount and positioned in a disengaged position.

FIG. 3 is a perspective view of the shield 24 of the PCI circuit board 22 of FIG. 2 inserted into the shield mount 14 in a disengaged position wherein the tab 36 is longitudinally displaced in the disengaging direction 43, with respect to the receptor 40. The disengaging direction 43 is opposite to the engaging direction 46 and is generally along the longitudinal axis of the shield 24. In the disengaged position, the extending tongue 24 contacts the inside of the tailgate 10 with tab 36 projecting outward through the tab opening 48. In the disengaged position, the receptor 40 does not substantially interfere or impede with the narrow end 42 of the shield 24.

Figure 4:
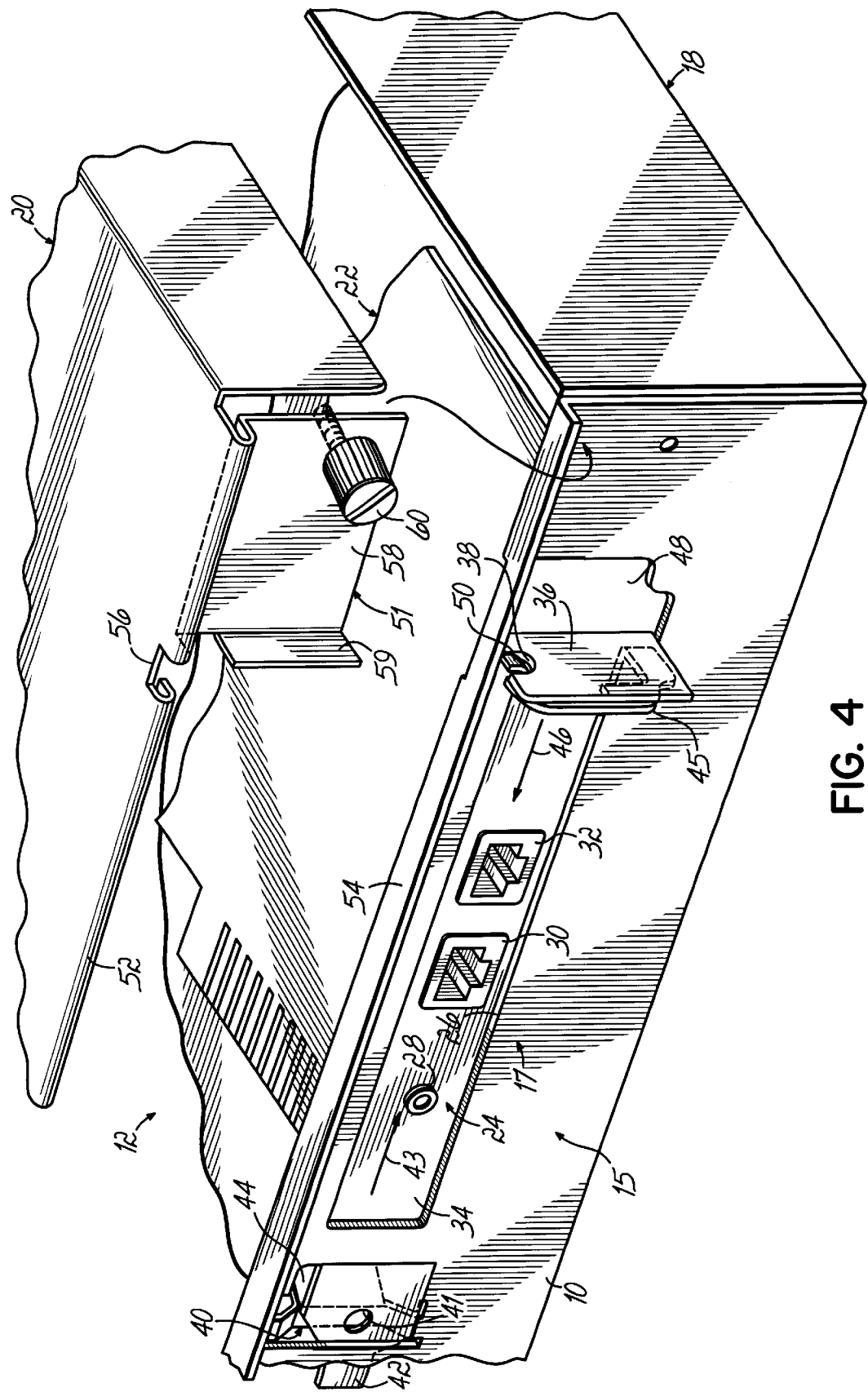
FIG. 4 is a perspective view of the enclosure of FIG. 1, with the shield of the expansion card inserted into the shield mount to an engaged position, and with a cover of the enclosure shown in proximity thereto.

FIG. 4 is a perspective view of the shield 24 of FIG. 3 inserted into the shield mount 14 in an engaged position. The narrow end 42 is fully engaged within the receptor 40. The support member 45 prevents any further movement of the shield 24 in the engaging direction 46 beyond the engaged position. The locking detent 50 fits within the locking recess 38 when the shield 24 is in the engaged position, preventing inward pivoting of the shield about its narrow end 42.

A computer motherboard (not shown) generally provides electrical interconnection to the other components in the enclosure 12 as well as additional physical support to the circuit board 22. An edge connector on the mother board is aligned to receive an edge connection along a side of the circuit board 22 perpendicular to the shield 24 when the shield 24 in the disengaged position. This edge connection side of the circuit board 22 is adjacent to the extending tongue 34 of the shield 24. Furthermore, the edge connector of the motherboard is configured to be engaged to the edge connection of the circuit board 22 when the shield 24 is in the engaged position.

Figure 5:
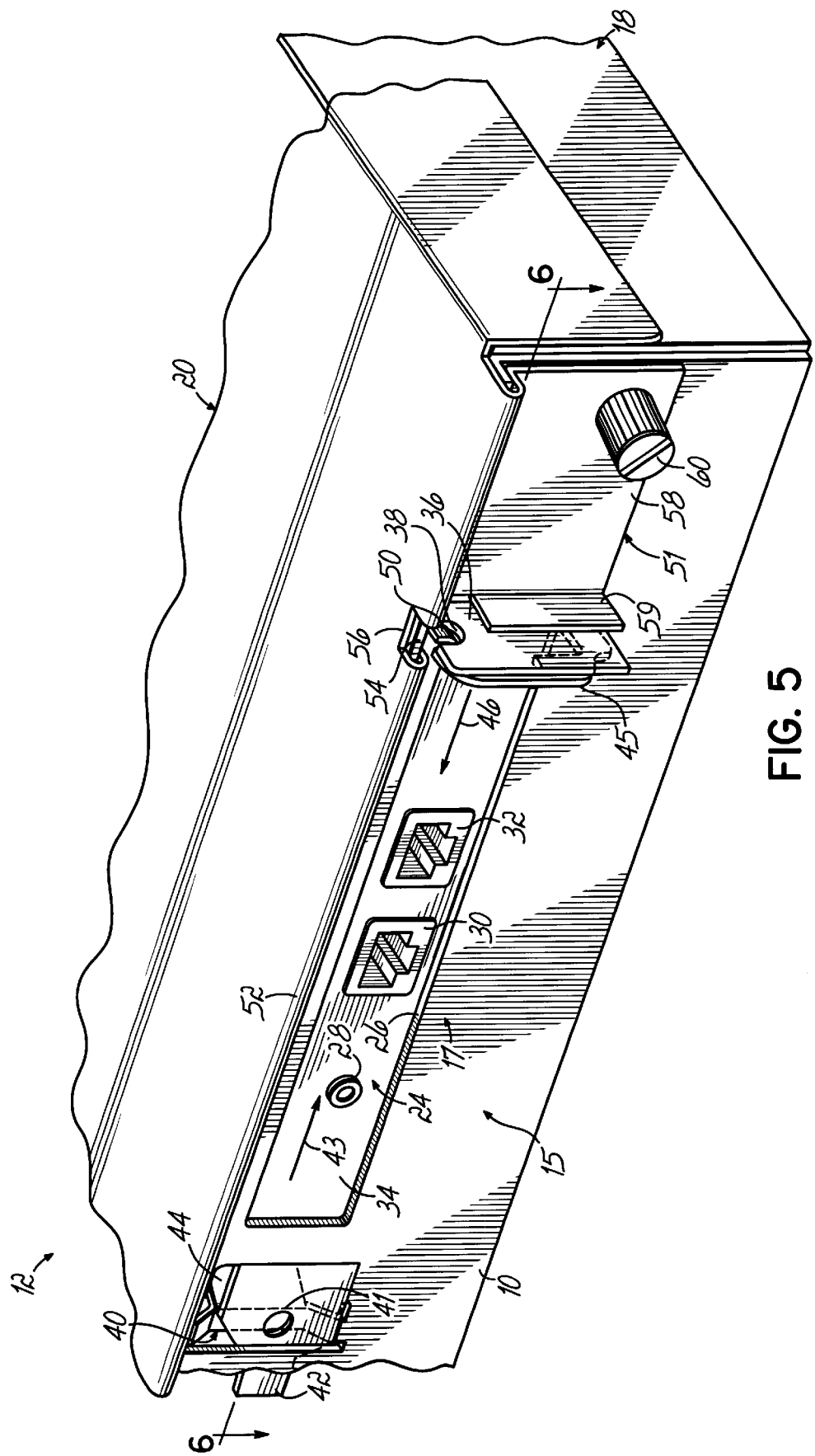
FIG. 5 is a perspective view of the enclosure of FIG. 1, with the shield of the expansion card retained in the engaged position by installation of the cover onto the housing.

Referring to FIGS. 4 and 5, a cover 20 includes features for secure mounting to the housing 18. The cover 20 provides a shield retainer 51 to cooperate with the tab opening 48, and advantageously the support member 45, to block the tab 36 in the engaged position. In particular, an inwardly opening cover curl 52 receives an outwardly bent lip 54 along the top edge of the tailgate 10. The curl 52 includes a tab cutout 56 to accommodate the tab 36 of the shield 24. A cover projection 58 extends from a portion of the curl 52 and registers at least to the tab opening 48 in the tailgate 10. The cover projection 58 also includes an outwardly projecting surface 59 registered to oppose the tab 36 from moving in the disengaging direction 43. Since the illustrative version of the enclosure 18 has a horizontally aligned shield mount 14, the tab 36 is tangentially aligned to the cover projection 58 during mounting of the cover 20.

The cover projection 58 advantageously includes a fastener attachment, such as a thumb screw 60, for fastening the cover 20 to the housing 18 without tools. Other fastener attachments, installed with or without assistance of a tool, may be used, such as a metal screw, wing nut, prop rivet. In some application consistent with aspects of the invention, the cover projection 58 may have no fastener attachment.

Figure 6:
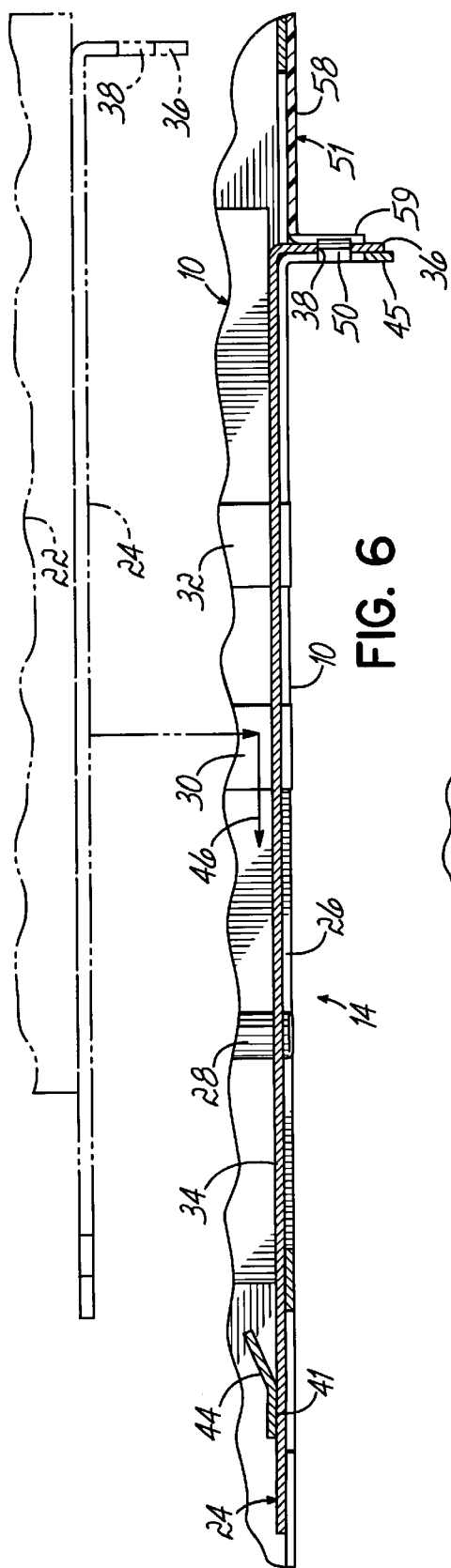
FIG. 6 is a cross sectional view of the enclosure of FIG. 5 taken along lines 6—6.

FIG. 6 is a cross sectional view of the installed shield 24 of FIG. 5, generally along lines 6-6, illustrating how a shield 24 is received within the receptor 40 and tab opening 48 and retained in place by the cover 20. In particular, the tongue 34 is aligned in parallel to the plane of the tailgate 10, and is outwardly moved, as at arrow 61, to be in contact with, or at least proximate to, an inner surface of the tailgate 10. The shield 24 may not move further in the outward direction 61. The tab 36 is thereafter displaced in the engaging direction 46 until proximate to or in contact with the support member 45. Meanwhile, the narrow end 42 of the tongue 34 enters a space defined between the ramp 44 and the tailgate 10 and is guided into a narrow space between the lateral band 41 of the receptor and the tailgate 10. Once in the engaged position, the locking detent 50 of the support member 45 engages the locking recess 38 of the tab 36, preventing movement of the tab 36 transverse to the plane of the tailgate 10. In addition, the surface 59 of the cover projection 58 prevents movement of the tab 36, and thus the shield 24, in the disengaging direction 43.

Figure 7:
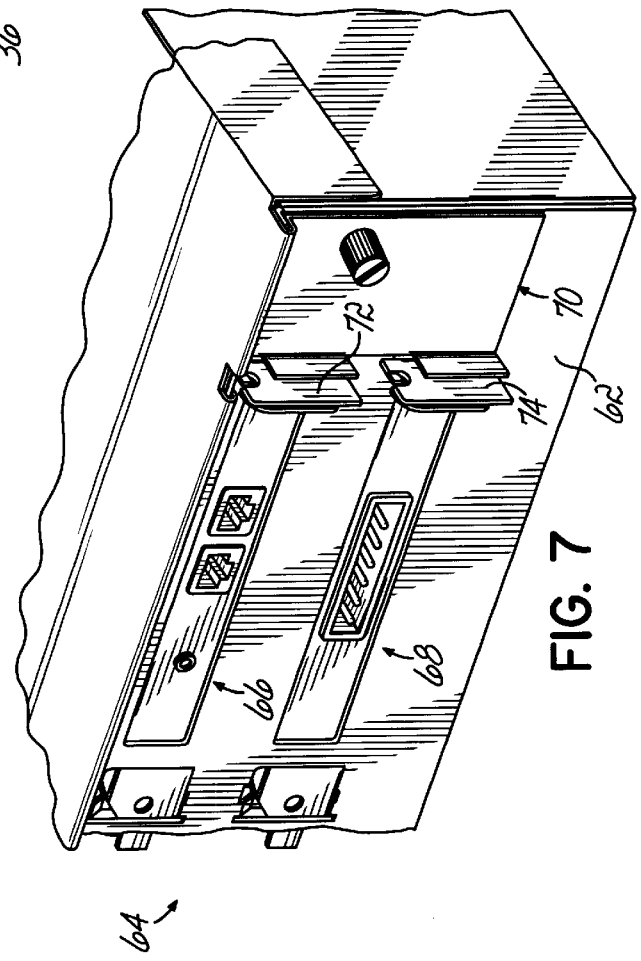
FIG. 7 is a perspective view of a tailgate of another computer enclosure consistent with the invention including two stacked shield mounts tangentially retained by a cover.

FIG. 7 is a perspective view of another design of tailgate 62 on a computer enclosure 64, including two stacked shield mounts 66, 68 tangentially retained by a single cover projection 70 that is tangentially proximate or in abutment to both tabs 72, 74.

Figure 8:
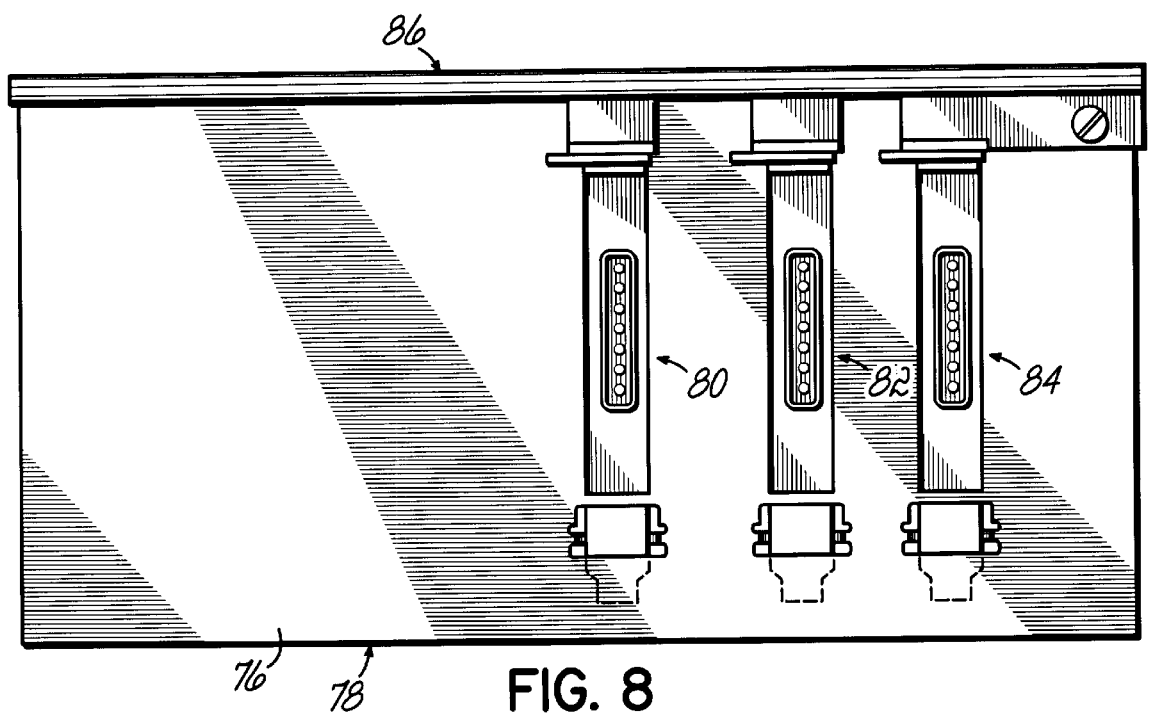
FIG. 8 is a side view of a tailgate of another computer enclosure consistent with the invention having a plurality of shield mounts perpendicularly retained by a cover.

FIG. 8 is a side view of another design of tailgate 76 of a computer enclosure 78 having a plurality of shield mounts 80, 82, 84 perpendicularly retained by a cover 86.

These various orientations of shield mounts 14, 16, 80, 82, 84 benefit from a shield retainer 51 incorporated into the respective cover 20, 86. Thus, covers 20, 86 consistent with aspects of the invention incorporate various shield retainers 51, such as one or more cover projections 58, with each cover projection 58 retaining one or more shields 24 in the engaged position. In addition, a cover 20 consistent with aspects of the invention may have no cover projection 58, especially for vertically oriented shield mounts 80, 82, 84 wherein the engaged position is defined with the tabs 36 of the shields 24 flush with the top of the tailgate 76 (not shown). Thus, the tab openings 48 would provide the longitudinal movement of the thickness of the tabs 36 to achieve this flush configuration and the adjacent portion of the cover 20 acts as the shield retainer 51.

In use, an enclosure 12 is opened to insert a circuit board 22 by removing a cover 20 from a housing 18. The housing includes a panel, or tailgate 10, that has shield mount 14 to receive the shield 24 attached to the circuit board 22. The tab 36 of the shield 24 is inserted through a tab opening 48 in the tailgate 10 with the extending tongue 34 of the shield 24 approximately adjacent to the inner surface of the tailgate 10. From this disengaged position, the shield 24 is slid in an engaging direction 46 until the extending tongue 34 is engaged by a receptor 40 and the tab 36 is blocked in the engaging direction 46 by an outwardly projecting support member 45. The shield 24 is then locked into place by installing the cover 20 onto the housing 18. The cover 20 has a cover projection 58 that overlays the tailgate 18, covering the tab opening 48 and restraining any movement of the tab 36 in the disengaging direction 43 with a shield retainer 51. Removal is the reverse of the above.

Other modifications may be made to the illustrated embodiments consistent with the invention. Therefore, the invention lies in the claims hereinafter appended.

What is claimed is:

1. An enclosure for engaging a shield including a tongue and a laterally extending tab at opposing ends thereof, the enclosure comprising:
   a housing configured to receive the shield, the housing including:
      a receptor configured to receive the tongue of the shield as the shield is moved longitudinally between disengaged and engaged positions; and
      a tab opening defined in the housing and configured to receive the tab, the tab opening sized and configured to permit movement of the shield between the disengaged and engaged positions while the tab is received within the tab opening;
   a cover configured to be removably secured to the housing; and a shield retainer disposed on the cover and configured to restrict movement of the tab when the cover is secured to the housing and thereby restrict movement of the shield from the engaged position to the disengaged position.

2. The enclosure of claim 1, wherein the housing further includes:
a support member laterally proximate to the tab opening to restrict movement of the tab beyond the disengaged position.

3. The enclosure of claim 2, wherein the support member includes a detent configured to register to a recess in the tab of the shield and thereby restrict movement of the shield in at least one direction within a transverse plane to a longitudinal axis of the shield.

4. The enclosure of claim 2, wherein the housing includes a panel, the panel comprising a sheet material, and wherein the receptor and support member are formed by separating contours for the receptor and support member respectively from the sheet material and displacing in laterally opposite directions the receptor and support member from a plane of the sheet material.

5. The enclosure of claim 2, the housing further including:
an expansion slot opening defined in the panel between the receptor and the support member.

6. The enclosure of claim 5, wherein the expansion slot opening is integrated within the tab opening, the support member including:
a recess defined in the support member integrated with the expansion slot and tab openings and configured to allow a connector projecting from the shield to translate unimpeded through the recess as the shield is moved longitudinally between disengaged and engaged positions.

7. The enclosure of claim 1, further comprising a motherboard enclosed within the housing and having an edge connector configured to receive an expansion card with an edge connection along a perpendicularly adjacent side to the shield, the receptor and tab opening in the housing defining a shield mount, the shield mount aligned with respect to the edge connector such that the disengaged position of the shield corresponds to the edge connection of the expansion card aligned with the edge connector and such that the engaged position of the shield corresponds to the edge connection engaged to the edge connector.

8. The enclosure of claim 1, wherein the receptor comprises a band coupled across the housing perpendicular to a longitudinal axis of the axis, the band displaced along a portion of its length to at least a cross sectional contour of the shield.

9. The enclosure of claim 8, wherein the receptor further includes a ramp coupled along an engaging edge of the band, the ramp configured to guide the tongue of the shield into the band of the receptor.

10. The enclosure of claim 1, wherein the shield retainer comprises a cover projection configured to overlay a portion of the housing including the tab opening.

11. The enclosure of claim 10, wherein the cover projection includes a surface registered to align with the tab of the shield.

12. The enclosure of claim 10, wherein the cover projection includes a fastener attachment.

13. The enclosure of claim 12, wherein the fastener attachment includes a thumb screw.

14. A method of making an enclosure including a housing for receiving a shield of an expansion card, the shield including a tongue and a laterally extending tab at opposing ends thereof, the method comprising:

forming a tab opening in the housing, the tab opening laterally sized to receive the tab of the shield with the tongue of the shield proximate to and aligned with the shield mount, the tab opening longitudinally sized to allow displacement of the tab along the longitudinal axis of the shield between a disengaged position and an engaged position; and forming a receptor in the housing longitudinally displaced from the opening sufficient to clear the tongue of the shield when the tab is inserted through the tab opening at the disengaged position and to engage the tongue of the shield when the tab is translated to the engaged position.

15. The method of claim 14, further comprising:
forming a cover configured to be removably secured to the housing; and,
forming a shield retainer disposed on the cover configured to restrict movement of the tab when the cover is secured to the housing and thereby restrict movement of the shield from the engaged position to the disengaged position.

16. The method of claim 14, wherein forming the receptor in the panel further comprises:
separating a band laterally across the shield mount; and
displacing the band along its length from a plane of shield mount.

17. The method of claim 16, wherein forming the receptor further includes:
forming a ramp coupled to an edge of the band that is configured to guide the tongue of the shield into the band of the receptor as the tab of the shield translates from the disengaged position to the engaged position.

18. The method of claim 14, wherein forming the tab opening further comprises:
separating from the housing a rectangular contour along three sides, leaving a side of the rectangular contour in the disengagement direction attached to the housing; and
laterally displacing the separated rectangular contour about the attached side from the plane of the shield mount to form a support member configured to register to the tab of the shield when the tab is longitudinally displaced to the engaged position.

19. The method of claim 18, further comprising:
forming a locking detent on the support member configured to register to a locking recess in the tab of the shield and thereby restrict movement of the shield in at least one direction within a transverse plane to a longitudinal axis of the shield.

20. The method of claim 14, further comprising
forming a connector opening in the housing along the longitudinal axis of the expansion card shield mounting between the receptor and the tab opening, the connector opening configured to register to a connector on the tongue of the shield.

21. A computer including an enclosure for engaging a shield including a tongue and a laterally extending tab at opposing ends thereof, the enclosure comprising:
a housing configured to receive the shield, the housing including:
a receptor configured to receive the tongue of the shield as the shield is moved longitudinally between disengaged and engaged positions; and a tab opening defined in the housing and configured to receive the tab, the tab opening sized and configured to permit movement of the shield between the disengaged and engaged positions while the tab is received within the tab opening;

a cover configured to be removably secured to the housing; and a shield retainer disposed on the cover and configured to restrict movement of the tab when the cover is secured to the housing and thereby restrict movement of the shield from the engaged position to the disengaged position.

22. The computer of claim 21, wherein the housing further includes:

a support member laterally proximate to the tab opening to restrict movement of the tab to the disengaged position as the shield is moved longitudinally from the engaged position to the disengaged position.

* * * * *